(12) United States Patent
Gaudenz (10) Patent No.: US 12,021,512 B2
(45) Date of Patent: Jun. 25, 2024

(54) ELECTRONIC SWITCH AS A DAMPING ELEMENT

(71) Applicant: Siemens Aktiengesellschaft, Munich (DE)

(72) Inventor: Markus Matthias Gaudenz, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 17/430,262

(22) PCT Filed: Feb. 12, 2020

(86) PCT No.: PCT/EP2020/053531
§ 371 (c)(1),
(2) Date: Aug. 11, 2021

(87) PCT Pub. No.: WO2020/165205
PCT Pub. Date: Aug. 20, 2020

(65) Prior Publication Data
US 2022/0045670 A1 Feb. 10, 2022

(30) Foreign Application Priority Data
Feb. 14, 2019 (EP) .................................. 19157079

(51) Int. Cl.
*H02H 3/08* (2006.01)
*H02H 9/02* (2006.01)
(Continued)

(52) U.S. Cl.
CPC ....... *H03K 17/0822* (2013.01); *H03K 17/165* (2013.01); *H02H 3/08* (2013.01); *H03K 2217/0027* (2013.01)

(58) Field of Classification Search
CPC .................. H03K 17/0822; H03K 17/165
(Continued)

(56) References Cited

U.S. PATENT DOCUMENTS 6,972,611 B1 12/2005 Thalheim
7,031,130 B2 * 4/2006 Simonelli ............... G05F 1/571
361/58
(Continued)

FOREIGN PATENT DOCUMENTS

DE  10 2012 216 558 A1  3/2013
EP  2 928 054 A1  10/2015
(Continued)

OTHER PUBLICATIONS

PCT International Search Report and Written Opinion of International Searching Authority dated May 13, 2020 corresponding to PCT International Application No. PCT/EP2020/053531 filed Feb. 12, 2020.

*Primary Examiner* — Jared Fureman
*Assistant Examiner* — Lucy M Thomas
(74) *Attorney, Agent, or Firm* — Henry M Feiereisen LLC (57) ABSTRACT

An electronic switch for connecting units of a power supply system has a semiconductor switch, an actuation circuit and a current/voltage sensor for detecting current flow through the electronic switch. The actuation circuit operates the semiconductor switch, depending on oscillations measured by the current/voltage sensor, in an activated state, a deactivated state or a linear mode. A power supply system having the electronic switch for connecting with the electronic switch two electrical sub-networks and a method for operating the electronic switch are also disclosed. The semiconductor switch is operated at least temporarily in the linear mode for damping oscillations.

13 Claims, 3 Drawing Sheets

(51) Int. Cl.
   *H03K 17/082*   (2006.01)
   *H03K 17/16*    (2006.01)
(58) Field of Classification Search
   USPC .......................................................... 361/93.1
   See application file for complete search history.

(56) References Cited

U.S. PATENT DOCUMENTS

| | | | | |
|---|---|---|---|---|
| 9,036,314 | B2* | 5/2015 | Kanamori | H02H 9/004 |
| | | | | 361/93.9 |
| 9,590,419 | B2* | 3/2017 | Boe | H02J 3/28 |
| 2009/0261898 | A1 | 10/2009 | Sachdev et al. | |
| 2013/0069612 | A1 | 3/2013 | Feldtkeller | |
| 2017/0214311 | A1 | 7/2017 | Friedrich | |
| 2017/0346384 | A1* | 11/2017 | Davidson | H02M 5/45 |

FOREIGN PATENT DOCUMENTS

| | | | |
|---|---|---|---|
| EP | 2 928 064 | A1 | 10/2015 |
| WO | WO 2002-007315 | A1 | 1/2002 |

* cited by examiner

ELECTRONIC SWITCH AS A DAMPING ELEMENT

CROSS-REFERENCES TO RELATED APPLICATIONS

This application is the U.S. National Stage of International Application No. PCT/EP2020/053531, filed Feb. 12, 2020, which designated the United States and has been published as International Publication No. WO 2020/165205 A1 and which claims the priority of European Patent Application, Serial No. 19157079.5, filed Feb. 14, 2019, pursuant to 35 U.S.C. 119(a)-(d).

BACKGROUND OF THE INVENTION

The invention relates to an electronic switch having a semiconductor switch with an actuation circuit. The invention further relates to a power supply system having an electronic switch of this kind. The invention furthermore relates to a method for operating an electronic switch of this kind or a power supply system of this kind.

Switches are nowadays used for, among other things, enabling electrical loads to be isolated from the network in power supply systems. Likewise, with the help of the switch, it is possible to disconnect parts of a power supply network. The disconnection can in this case be carried out for operational reasons or else to protect components of the power supply network when a fault occurs.

Power distribution systems are nowadays usually embodied as AC networks. Different voltage levels can then easily be achieved by means of transformers. The protection of individual outgoing circuits or of the individual voltage levels is in this case achieved using mechanical switches. In this case, in an ON state a conductive connection is created, whereas in the OFF state the input and output terminals of the switch are electrically isolated from one another. Switching between the ON and OFF state is effected in the mechanical switch by the movement of a conductive element.

Besides mechanical switches, switches based on semiconductor switches are also known. These switches are also called electronic switches. They are characterized in that they can switch very quickly. Additionally, these switches do not need a current zero for disconnection, such that these electronic switches are also in particular suitable for use in a DC voltage network. The low inductances due to the absence of transformers in DC voltage networks produce high rates of current rise, which make a fast disconnection necessary before impermissibly high current intensities are reached.

The object of the invention is to improve an electronic switch.

SUMMARY OF THE INVENTION

This object is achieved by an electronic switch, wherein the electronic switch has a semiconductor switch with an actuation circuit and a current sensor for detecting a current flowing through the electronic switch, and/or a voltage sensor, wherein the actuation circuit is designed to operate the semiconductor switch as a function of oscillations which are measured by means of the current sensor and/or the voltage sensor in an activated state, in a deactivated state or in linear mode. This object is further achieved by a power supply system having an electronic switch of this kind and two electrical sub-networks, wherein the two electrical sub-networks are connected to one another by means of the electronic switch. This object is further achieved by a method for operating an electronic switch of this kind or a power supply system of this kind, wherein the semiconductor switch of the electronic switch is operated at least temporarily in linear mode for damping oscillations.

Further advantageous embodiments of the invention are specified in the dependent claims.

The invention is based on the finding that an electronic switch can be improved by enabling it to adopt, in addition to the states ON and OFF already known from a mechanical switch, also called the activated state and deactivated state as well as the conductive state and nonconductive state, a third state in which the semiconductor switch of the electronic switch is operated in linear mode. In this case the operating point of the semiconductor switch is in a linear range. This is also called the amplification range. In linear mode a current flows through the semiconductor and a voltage is applied to the connection terminals, between which the switching action is effected. In this third state electrical losses accrue at the electronic switch, comparable with those of a resistor. These result from the product of the current through the electronic switch multiplied by the voltage applied across the electronic switch. The switching states ON and OFF result in no appreciable losses, since either no current flows or no voltage is applied to the electronic switch, such that the product of current and voltage becomes zero. Hence for applications in power electronics, such as for example power converters, DC choppers, etc., only the two switching states ON and OFF are used, in order to keep the losses low. However, by adapting the actuation circuit it is possible to transfer the electronic switch into the third state, the linear mode, in which both a voltage drops across the switch and a current flows through said switch. Since this generates comparatively high losses, this state has hitherto not been used in power electronics.

With linear mode, losses can in addition be selectively introduced into the power supply system. These can be used for example to reduce undesired currents. Examples of undesired currents include excessively high currents that can damage or destroy the components in the power supply system, or currents which because of their frequency do not contribute to power transmission. These currents are also called reactive currents and occur for example because of oscillations, in which power stores of the power supply system interact with one another and exchange power which oscillates between said power stores. These place a strain on the power supply system, without contributing to the desired transmission of power between the power sources and the electrical loads.

In a power supply system high currents occur for example if capacitive loads, i.e. electrical loads with capacitive behavior, are connected to the network. Power converters or DC choppers such as DC/DC converters are one example of this that can be mentioned. These have a capacitor which charges up on connection to a power source. Very high charging currents sometimes occur in this case. These charging currents are often limited with the help of precharging resistors. These precharging resistors can be dispensed with if the electronic switch identifies an excessively high current or if, for example on the basis of the rate of current rise, the electronic switch identifies the occurrence of a potentially excessively high current. In this case the electronic switch is operated in linear mode. This means the charging currents that arise, for example as a result of capacitors being charged up, is limited. Special precharging resistors can then be dispensed with. The operating point of the semiconductor switch can in this case be adapted such that the charging takes place with the maximum permissible current. As a result, rapid charging of the capacitor can be achieved.

It is likewise possible, for all switching actions in which a high current, in particular a charging current, can be expected, for the semiconductor switch of the electronic switch to be operated in linear mode for a predefined period. The identification of excessively high currents or potentially excessively high currents can then be dispensed with.

The electronic switch can likewise be used to limit starting currents that occur on starting up a motor that is connected directly, i.e. without a power converter, to a power source. Here too, the electronic switch is operated in linear mode until a particular speed is reached, in order to limit the starting currents. In this case, in an advantageous embodiment, as the speed of the motor increases the operating point of the linear mode can be adjusted such that the motor is supplied with its maximum permissible current. This enables a fast transition from the startup phase of the motor to the operating phase.

Furthermore, the possibility always exists of exciting resonances present in the power supply system, for example because of switching operations. These resonances may be present in the power supply system because of the interaction of inductive components (busbars, transformers, electrical loads, power sources, network filters, etc.) and capacitive components (parallel busbars, winding capacity of the transformers, electrical loads, power sources, network filters, backup capacitors, etc.). The excitation may for example be caused by activating the electronic switch and results in oscillations in the current and/or voltage characteristic in the power supply system. Additionally there are a number of further possibilities that result in oscillatory phenomena in the power supply system. These oscillations can be damped by damping resistors in the power supply system. These then generate losses and reduce the economic viability of the power supply system. The oscillations can be limited and suppressed in linear mode with the help of the electronic switch. One advantage of this is that the linear mode is implemented only if the oscillations are present and only generates losses at this time. If no oscillations are present, the electronic switch is operated in the activated state or in the deactivated state and the electronic switch works at least virtually loss-free. Damping resistors, which continuously generate losses in the power supply system, can be dispensed with.

By using an electronic switch with the possibility of operating it in linear mode, the power distribution system no longer needs any resistors. Precharging resistors, startup resistors and damping resistors can be replaced by the linear mode of the electronic switch. The behavior of the resistors is active only if it is required. This means permanent losses can be prevented.

Thus a state of the semiconductor switch, which at first glance looks very disadvantageous in power electronics because of the losses, is used for operation. The following advantages can thereby be achieved. Resistors for current limitation, precharging, startup current limitation, oscillation damping and voltage clearing are no longer required. This results in lower costs, a lower space requirement and greater reliability and availability thanks to fewer components. Since the described states, in which the linear mode of the electronic switch is active, are only of brief duration, there is little if any requirement for cooling of the electronic switch. If cooling for the electronic switch is provided, it has proved advantageous to fit the electronic switch proposed here with a cooling element for cooling with air. This has a high thermal capacity and is hence suitable in particular for taking up and dissipating electrical losses that accrue in the short term.

In this case the electronic switch has a current transformer and/or a voltage transformer. The voltage transformer can here measure a voltage applied to the electronic switch compared to a reference potential. Alternatively or additionally, the voltage transformer can also measure a voltage in the power supply system. For example, the voltage of the power supply system, also called the power supply network, can be measured here. In a DC voltage network in particular, the voltage of the DC voltage network is often supported by means of capacitors. The voltage at the capacitor can in this case be measured by the voltage sensor.

The electronic switch can be used to interconnect two sub-networks of the power supply system. These subsystems can here have power sources and/or electrical loads in each case. Thanks to the electronic switch the components can be interconnected to increase the security of supply. At the same time, in the event of a fault, failure-free operation of the individual sub-networks can be ensured by rapidly isolating the sub-networks.

The oscillation can be identified by the sensor by evaluating the measurement values. For example, a Fourier analysis can be used for this. The evaluation can for example be carried out in the frequency range or in the time range. In this case, desired oscillations, such as the network frequency for example, and undesired oscillations, transient oscillations for example, can advantageously be distinguished from one another by masking out the frequency portions of the network voltage when determining the oscillations, for example by means of analog and/or digital filtering.

In an advantageous embodiment of the invention, the electronic switch can be operated as a precharging resistor and/or startup resistor and/or damping resistor. In other words, in an advantageous embodiment of the invention the actuation circuit of the electronic switch is designed to damp oscillations by operation in linear mode as a damping resistor. The operating point in linear mode of the semiconductor switch can be selected such that the operating point corresponds to the behavior of a resistor. Thus a resistor value can be predefined which is converted by the actuation circuit into an operating point of the semiconductor switch in the linear range, in which a voltage arises at the semiconductor switch and a current through the semiconductor switch, the quotient of which corresponds to the resistance value. Thanks to regulation on the basis of resistors, preexisting resistors in the power supply system can be easily replaced. A design of the damping in the system which is produced on the basis of resistors can also easily be implemented by the electronic switch, for example with the help of a calculation tool for electrical networks. Calculations can likewise be used to establish ranges of resistance values in which the power supply system can be operated in a stable manner. This ensures that the regulation/control based on resistance values also works reliably and in a stable manner.

In a further advantageous embodiment of the invention, the electronic switch is designed to damp oscillations arising as a result of transient phenomena because of a switching action of the electronic switch. Oscillations can be excited in the power supply system due to a switching action of the electronic switch. These can easily be eliminated by the electronic switch if the latter is operated at least temporarily, until decay, in linear mode. In this case the electronic switch can already be operated in linear mode during the transition from the deactivated state to the activated state for a particular length of time as an intermediate step, in order thereby to achieve smooth switching, in which oscillations are not excited and even damped. Alternatively it is possible to examine the measurement values of current sensor and/or voltage sensor for undesired oscillating portions. Undesired portions in this case are oscillating transient phenomena between power stores in the power supply network, such as for example line inductances, backup capacitors and/or capacitive or inductive behavior of electrical loads. One example of the capacitive behavior of an electrical load is the intermediate circuit capacity of a power converter. All these power stores can cause transient phenomena during switching, in DC voltage networks in part with high currents, which can be eliminated rapidly with the proposed electronic switch. This enables fault-free and reliable operation of the power supply system.

In a further advantageous embodiment of the invention the electronic switch has a current sensor and/or a voltage sensor, wherein as a function of a measurement value of the current sensor and/or of the voltage sensor the semiconductor switch of the electronic switch can be operated in linear mode. Likewise the power supply system can have at least one current sensor and/or one voltage sensor, wherein as a function of a measurement value of the current sensor and/or of the voltage sensor the semiconductor switch of the electronic switch can be operated in linear mode. The current sensor and/or a voltage sensor of the power supply system can be the sensor of the electronic switch. Likewise it is possible to arrange the corresponding sensor alternatively in another position in the power supply system. Furthermore, it is also possible to arrange a corresponding sensor in each case both in the electronic switch and in another position in the power supply system.

To operate an electronic switch of this kind or a power supply system of this kind it has proved advantageous for the semiconductor switch of the electronic switch to be operated in linear mode if a measurement value of the current sensor and/or of the voltage sensor exceeds a predefined limit value.

To identify overcurrents, i.e. impermissibly high currents, and oscillations, in particular current or voltage oscillations that possess a particular frequency, it has proved worthwhile to arrange corresponding sensors, in particular current sensors and/or voltage sensors, in the electronic switch and if appropriate additionally or alternatively in the power supply system. These are arranged such that they detect currents that can be influenced at least in part by the electronic switch. This ensures that the linear mode of the semiconductor switch and the associated losses and corresponding heating is active only if it is genuinely required. Alternatively, without using current or voltage sensors, the linear mode can be provided whenever switching actions of the electronic switch are carried out. In this case the linear mode can be provided between the activated state and the deactivated state for a predefinable time. Thus oscillations during switching operations, along with charging currents or starting currents, can be reliably damped, without having to be detected beforehand.

In a further advantageous embodiment of the invention the power supply system is embodied as a DC voltage network. The use of the proposed electronic switch for a DC voltage network is particularly advantageous for various reasons. If only on account of the low inductances in the power supply system because of the absence of transformers, a faster switch is advantageous because of the high rates of current rise. The electronic switch can satisfy this requirement for fast switching.

In addition, power converters and DC converters (DC/DC converters) are connected directly by their intermediate circuit and thus by their intermediate circuit capacitor to the DC voltage network. High discharge currents arise here, which can be reliably controlled and reduced with the proposed electronic switch in linear mode. Likewise the DC voltage network often has backup capacitors that are used to buffer the network voltage. These too generate high charging currents during switching, that can be safely controlled and reduced by the electronic switch. The backup capacitors are capacitors which are arranged in a distributed manner in the power supply system and which support the voltage between the busbars, i.e. should keep it constant or at least reduce voltage fluctuations.

These backup capacitors can, with the line inductances, form oscillatory systems in which oscillations of currents can occur. These too can easily be damped and eliminated by the electronic switch in linear mode. The losses arising in this case due to the damping behavior only accrue if the damping, i.e. the linear mode, is active. If resistors are used for damping in the DC voltage network, electrical losses arise permanently and reduce the efficiency of the power supply system. Put another way, the use of the electronic switch increases the efficiency of the power supply system because in linear mode its losses are limited in time.

In a further advantageous embodiment of the invention the measurement value of the current sensor and/or of the voltage sensor is split into a direct portion and an alternating portion, wherein the semiconductor switch of the electronic switch is operated in linear mode if the direct portion of the measurement value of the current sensor and/or of the voltage sensor exceeds a first predefined limit value and/or if the alternating portion of the measurement value of the current sensor and/or of the voltage sensor exceeds a second predefined limit value. The split into direct portion and alternating portion makes it possible to detect the undesired state in the power supply system more accurately and to respond selectively accordingly. Whereas oscillating behavior is apparent in an alternating portion of the measurement signal, charging operations or starting currents can be identified at a direct portion or low-frequency portion. In this way it is possible to respond selectively between the individual undesired states in the network. Among other things, it is also possible to provide for different limit values, for example a first limit value for charging operations and starting currents and a second limit value for oscillations. Thus the electronic switch can be adapted and designed flexibly to meet the requirements of the power supply network.

In a further advantageous embodiment of the invention the value of the resistance is established as a function of the measurement value of the current sensor and/or of the voltage sensor. In particular if the regulation of the damping is determined on the basis of resistors, it has been proved to be advantageous if said resistance value depends on measured currents. Thus faults can be quickly corrected. At the same time the resistance value can be quickly adjusted to the state of the power supply system, which can be identified on the basis of the measurement values.

In a further advantageous embodiment of the invention, when the electronic switch is activated the semiconductor switch of the electronic switch changes in a first step from the deactivated state to the linear mode and in a second step from the linear mode to the activated state. If no sensors are present to determine the state in the power supply system, most excessively high currents and oscillations, along with other faults or undesired effects in the power supply system, can be eliminated, in that switching from a deactivated state to an activated state is effected via an intermediate step in which the semiconductor switch is operated in linear mode. This linear mode damps transient phenomena, which often arise due to the connection of electrical components such as electrical loads or power sources. Transient phenomena are to be understood as oscillations between power stores such as capacitors, for example, and also as charging operations of capacitors, which are present for example in the form of intermediate circuit capacitors in power converters, or starting currents, which for example arise when connecting uncontrolled motors to the power source. Thus the electronic switch can also easily be integrated into an existing power supply system without having to provide new measurement sensors for this purpose.

BRIEF DESCRIPTION OF THE DRAWING

The invention is described and explained in greater detail below on the basis of the exemplary embodiments illustrated in the figures, in which.

DETAILED DESCRIPTION OF PREFERRED EMBODIMENTS

Figure 1:
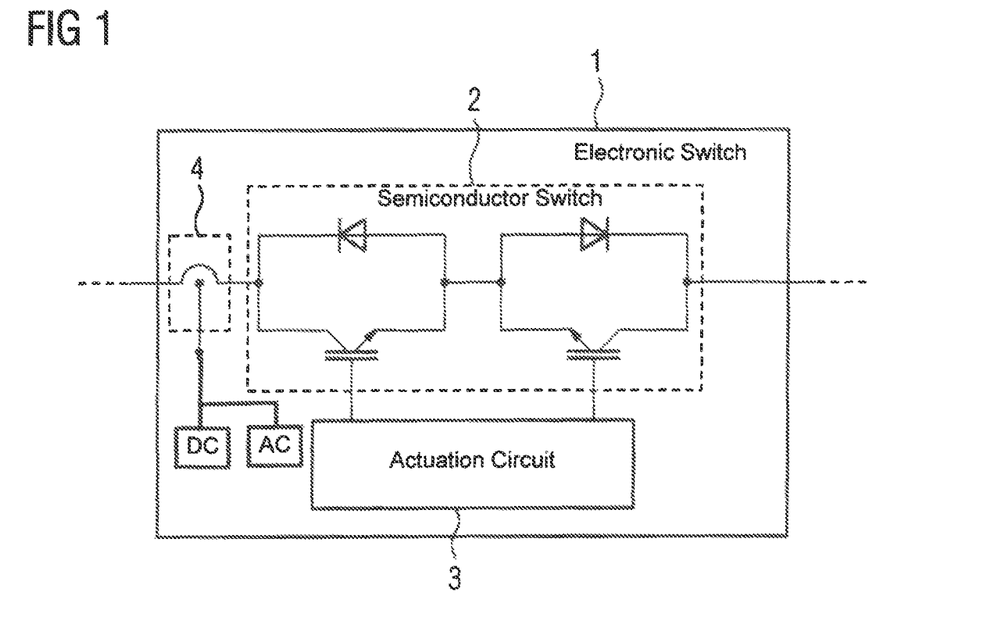
FIG. 1 shows an electronic switch.

FIG. 1 shows an electronic switch 1. This has a semiconductor switch 2 which with its two semiconductors can carry and disconnect a current in both directions. The semiconductor switch 2 with its semiconductors is controlled by an actuation circuit 3. This actuation circuit 3 enables the semiconductor switch 2 and thus the semiconductor arranged therein to be transferred to an activated state, a deactivated state and a linear mode. The activated state is called the conductive state, closed state or ON state. The deactivated state is also called the nonconductive state, open state or OFF state. The linear mode is also called operation in the linear range or operation in the amplification range. In this case the semiconductor switch 2 may be, but does not have to be, transferred into linear mode by the actuation circuit 3, as a function of a measured value, for example as a function of a measurement value of a current transformer 4, in order to prevent and reduce excessive currents or to damp oscillations. In this case the evaluation of the measurement value of the current transformer 4 can be carried out in the actuation circuit 3 or in a higher-level regulator and/or controller (not shown here).

Figure 2:
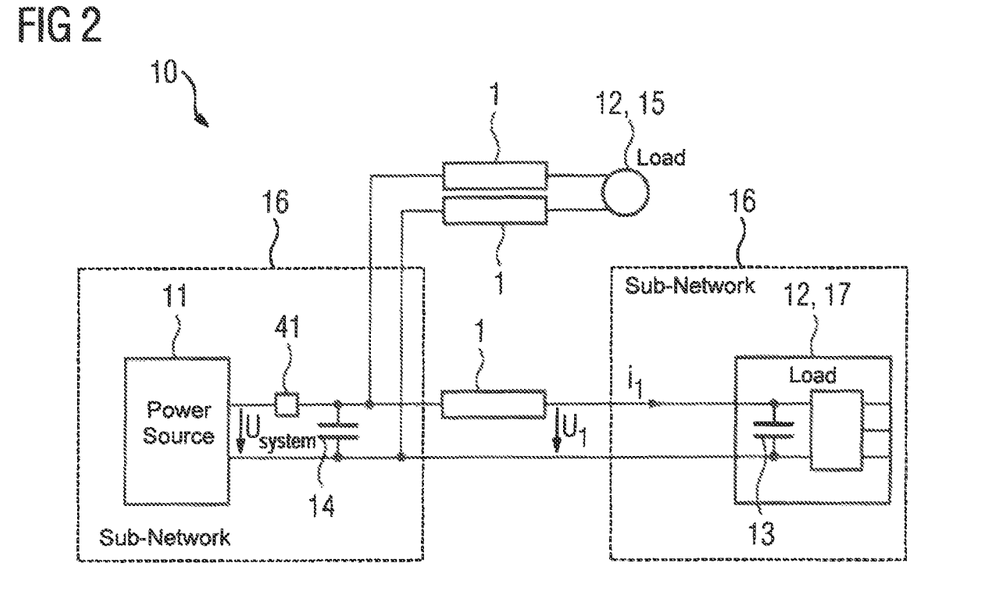
FIG. 2 shows a power supply system with an electronic switch.

FIG. 2 shows a power supply system 10, in which two sub-networks 16 of the electronic switch 1 are detachably interconnected. It is sufficient here to arrange an electronic switch in only one of the two conductors, in order to interrupt an exchange of power between the two sub-networks 16. One of the sub-networks 16 here has a power source 11 and a second of the sub-networks 16 has an electrical load 12. A further electrical load 12, for example a motor 15, is connected to the power source 11 via two other electronic switches 1. The power supply system 10 is here embodied as a DC voltage network. To support the voltage a backup capacitor 14 can be arranged here between the two conductors of the DC voltage network. In addition, further backup capacitors 14 can be arranged in a distributed manner in the power supply system. To measure currents a further current sensor 41 can as well be arranged in the power supply system 10 outside the electronic switch 1, additionally or alternatively to a current sensor 4 in the electronic switch 1. Both electronic switches 1 can influence the current measured by the further current sensor 41, since said current flows at least in part or proportionately through said electronic switch 1.

Both of these current sensors 4, 41 can be used jointly or only one of these current sensors 4, 41 can be used for the regulation or control of the electronic switch 1. For this reason no further distinction is made between the current sensor 4 and the further current sensor 41, but they are each both referred to as current sensor 4, 41. In addition it is also possible to operate the electronic switch 1 and/or the power supply system 10 without a sensor.

The electrical loads 12 are, in a first example, a motor 15 and, in a second example, a power converter 17. The motor 15 is connected to the DC voltage network directly via the electronic switch 1, i.e. without a further actuator. Hence when the electronic switch 1 is activated, high starting currents are to be expected. The behavior is similar with the power converter 17. Thanks to the intermediate circuit capacitor 13 at the input of the power converter 17, high charging currents are also to be expected here when the corresponding electronic switch 1 is activated. Both the starting currents and the charging currents can be reduced by operating the semiconductor switch 2 of the corresponding electronic switch 1 at least temporarily in linear mode.

The magnitudes shown in FIG. 2 of the system voltage $U_{system}$, the voltage $U_1$ and the current $i_1$ will be described in greater detail below. To this end a time characteristic of the voltage $U_1$ is specified in FIG. 3 and a time characteristic of the current $i_1$ in FIG. 4, as could arise for example during connection of the power converter 17 to the power source 11 by the controller/regulator. These show the basic function of the electronic switch 1. In principle this behavior can also be transferred to other loads 12, such as the motor 15 for example.

Figure 3:
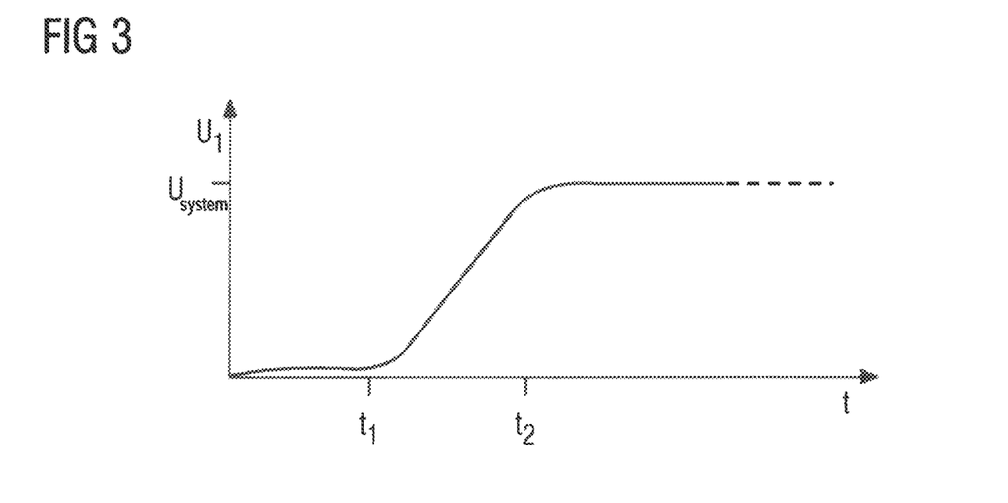
FIG. 3 to FIG. 6 show a time characteristic during activation of the electronic switch.
Figure 4:
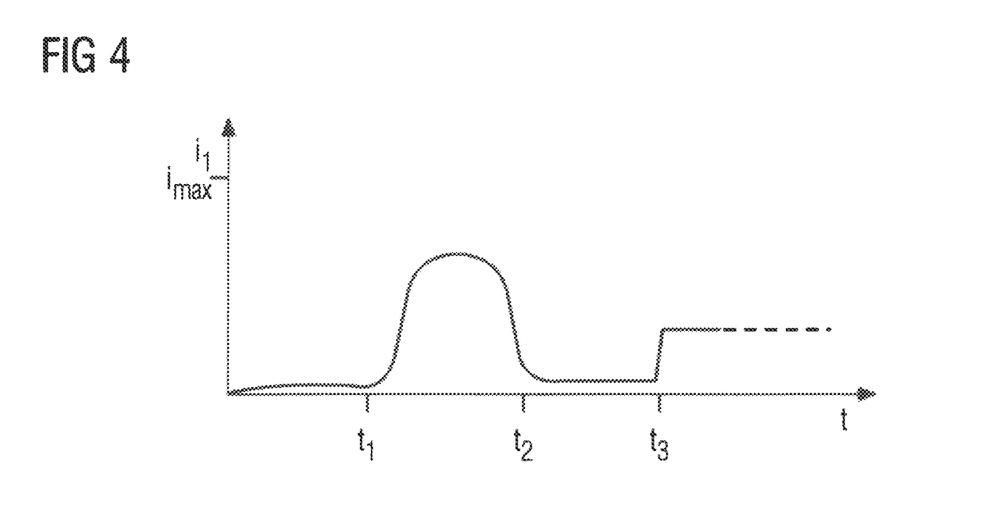

With this time characteristic the electronic switch 1 should be activated so that the electrical load 12 is connected to the power source 11. Regardless of whether the electrical load 12 is a power converter 17 or a motor 15 to be connected directly to the DC voltage network, high currents in the form of charging currents or starting currents are to be expected for the moment of activation. Hence the semiconductor switch 2 of the electronic switch 1 is transferred at time $t_1$ by the actuation circuit 3 into linear mode. This can be recognized in that the voltage $U_1$ does not change abruptly to $U_{system}$. In this mode the entire system voltage $U_{system}$ is not passed on to the electrical load 12, but some of it drops across the electronic switch 1. The lower voltage $U_1$ then applied at the input of the electrical load 12 results in a reduced current $i_1$, which is illustrated in FIG. 4. Thanks to this linear mode it is possible to limit the current below a permissible value $i_{max}$ or to regulate it to the value $i_{max}$. At the time $t_2$ these charging currents or starting currents are decayed, since the intermediate circuit capacitor 13 is charged up or the motor 15 is started. Thus at the time $t_2$ or thereafter the semiconductor switch 2 can be transferred to the activated state, in which no significant electrical losses occur in the electronic switch 1. As of a further time $t_3$ the electrical load goes into operation and draws power. This can be recognized by the rise in current there.

The electrical losses occurring in the period between $t_1$ and $t_2$ are only of short duration, such that they only briefly heat the electronic switch 1. Hence cooling can usually be dispensed with. Should cooling nevertheless be necessary, it can be easily implemented, usually without a fan, with an air cooling element because of the relatively small power loss.

Figure 5:
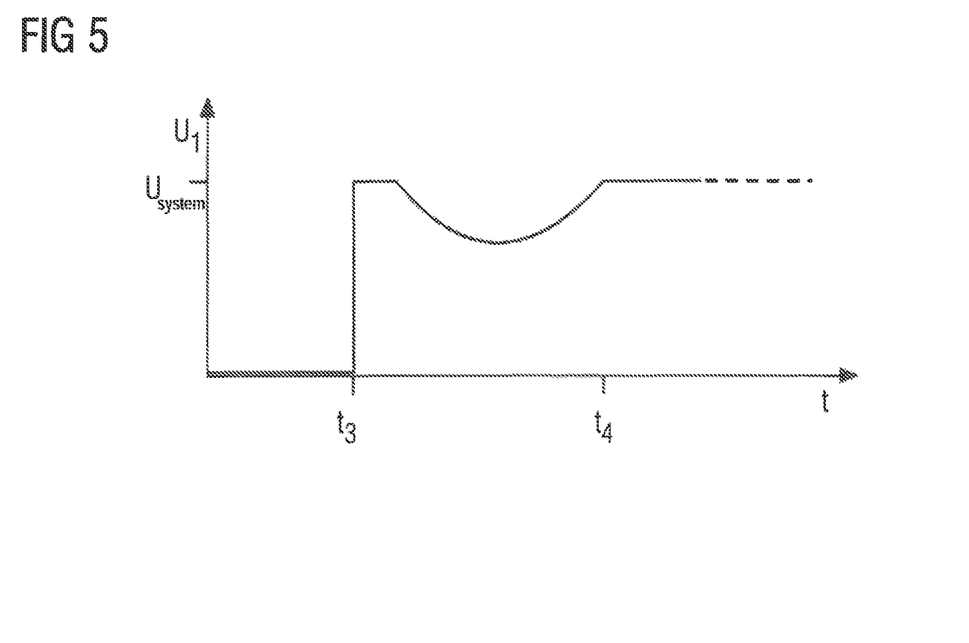
Figure 6:
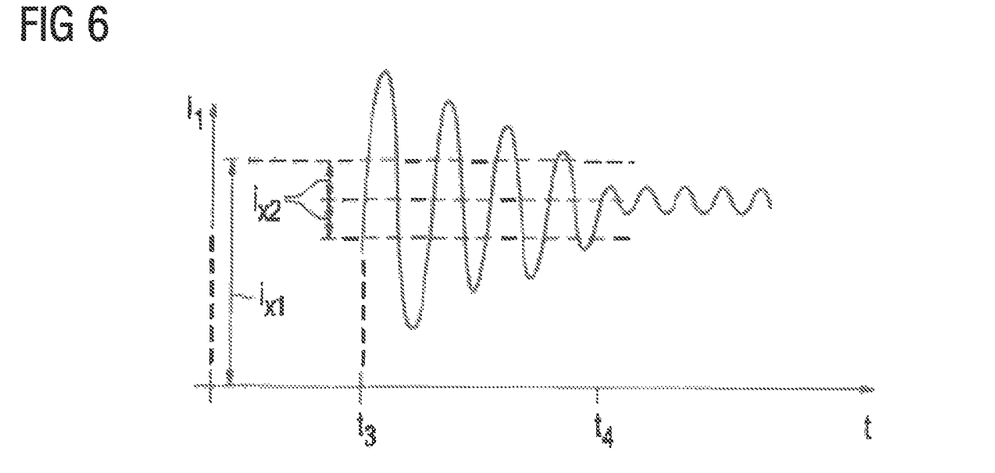

FIG. 5 and FIG. 6 show an example of the damping of an oscillation which arises as a result of a switching action of the electronic switch 1. At the time t3 the electronic switch 1 is activated. The current i1 through the switch 1 builds up quickly. At the same time transient phenomena occur between the sub-networks 16, which are apparent in an oscillating portion, i.e. in an oscillation, of the current i1. This is identified by the current sensor 4 and/or voltage sensor and the semiconductor switch 2 of the electronic switch 1 is operated in linear mode when the amplitude of the oscillation exceeds a predefined limit value $i_{x1}$, or when the measurement value of the current sensor and/or of the voltage sensor is split into a direct portion and an alternating portion (FIG. 1) and the alternating portion of the measurement value of the current sensor and/or of the voltage sensor exceeds a second predefined limit value $i_2$, such that because of the voltage drop across the electronic switch 1 only a reduced voltage u1 is present at the output. The electronic switch 1 thus acts as a damping resistor in the power supply system 10, such that the oscillation declines. At a time t4 the oscillation has decayed because of the damping by the electronic switch 1, such that the semiconductor switch 2 can again be operated with low loss in the activated state, Because of the characteristic of the semiconductor it is possible to respond quickly to oscillations that occur. This enables them to be eliminated before high amplitudes are reached. Thus the power loss for the damping is also comparatively low. In this case these advantages can easily be used by exploiting the linear mode of the semiconductor switch.

To summarize, the invention relates to an electronic switch having a semiconductor switch with an actuation circuit. To improve the electronic switch it is proposed for the actuation circuit to be embodied to operate the semiconductor switch in an activated state, in a deactivated state or in linear mode. The invention further relates to a power supply system having an electronic switch of this kind, at least one power source and at least one electrical load. The invention furthermore relates to a method for operating an electronic switch of this kind or a power supply system of this kind, wherein the semiconductor switch of the electronic switch is operated at least temporarily in linear mode.

In other words the invention relates in summary to an electronic switch, wherein the electronic switch has a semiconductor switch with an actuation circuit. In order to improve the electronic switch it is proposed that the electronic switch further has a current sensor for detecting a current flowing through the electronic switch and/or a voltage sensor and the actuation circuit is designed to operate the semiconductor switch as a function of oscillations, which are measured by means of the current sensor and/or of the voltage sensor, in an activated state, in a deactivated state or in linear mode. The invention further relates to a power supply system having an electronic switch of this kind and two electrical sub-networks, wherein the two electrical sub-networks can be interconnected by means of the electronic switch. The invention further relates to a method for operating an electronic switch of this kind or a power supply system of this kind, wherein the semiconductor switch of the electronic switch is operated at least temporarily in linear mode for damping oscillations.

The invention claimed is:

1. An electronic switch for connecting two sub-networks of a power supply system, the electronic switch comprising:
a semiconductor switch constructed to carry and disconnect a current in two directions,
a current sensor for detecting an AC component of the current flowing through the electronic switch,
an actuation circuit connected to the semiconductor switch and configured to operate the semiconductor switch, depending on oscillations measured by the current sensor, in an activated state, in a deactivated state or at least temporarily in a linear mode to damp oscillations when the current sensor detects that the AC component exhibits an oscillation with an amplitude that exceeds a predefined limit value and until the current sensor detects that the oscillation of the AC component falls below the predefined limit value, wherein the semiconductor switch, when operated by the actuation circuit in the linear mode, emulates a damping resistor to damp oscillations.

2. The electronic switch of claim 1, wherein a reactive current is reduced in the linear mode.

3. The electronic switch of claim 1, wherein the electronic switch is designed to damp oscillations caused by transient phenomena resulting from a switching action of the electronic switch.

4. The electronic switch of claim 1, wherein the electronic switch is designed to damp oscillations caused by transient phenomena between the sub-networks.

5. A power supply system, comprising:
two electrical sub-networks,
an electronic switch detachably interconnecting the two electrical sub-networks,
wherein the electronic switch comprises
a semiconductor switch constructed to carry and disconnect a current in two directions,
a current sensor for detecting an AC component of the current flowing through the electronic switch,
an actuation circuit connected to the semiconductor switch and configured to operate the semiconductor switch, depending on oscillations measured by the current sensor, in an activated state, in a deactivated state or at least temporarily in a linear mode to damp oscillations when the current sensor detects that the AC component exhibits an oscillation with an amplitude that exceeds a predefined limit value and until the current sensor detects that the oscillation of the AC component falls below the predefined limit value, wherein the semiconductor switch, when operated by the actuation circuit in the linear mode, emulates a damping resistor to damp oscillations.

6. The power supply system of claim 5, wherein the power supply system is embodied as a DC voltage network.

7. The power supply system of claim 5, wherein the actuation circuit is designed to damp oscillations between the two electrical sub-networks caused by transient phenomena between the two sub-networks as a result of switching of the electronic switch.

8. A method for operating an electronic switch configured to connect two sub-networks of a power supply system or for operating a power supply system employing the electronic switch, wherein the electronic switch comprises a semiconductor switch constructed to carry and disconnect a current in two directions, a current sensor for detecting a current flowing through the electronic switch, an actuation circuit connected to the semiconductor switch and configured to operate the semiconductor switch in an activated state, in a deactivated state or in a linear mode, the method comprising:

applying a control voltage to switch the semiconductor switch from the deactivated state into the linear mode to damp oscillations when the current sensor detects that an AC component exhibits an oscillation with an amplitude that exceeds a predefined limit value, and to switch the semiconductor switch from the linear mode to the activated state when losses in the semiconductor switch caused by the detected amplitude of the AC component have subsided.

9. The method of claim 8, wherein the oscillation results from an excitation of a resonance generated by inductive components and capacitive components in the power supply system when the electronic switch is switched on.

10. The method of claim 8, further comprising operating the semiconductor switch in the activated state once the oscillation has decayed due to damping by the electronic switch.

11. The method of claim 8, wherein the power supply system has an electrical load, the method further comprising operating the electronic switch in the linear mode in response to a change in a target value of the electrical load, in particular in response to an abrupt change in the target value.

12. The method of claim 8, further comprising:

emulating with the semiconductor switch a damping resistor when the actuation circuit operates the semiconductor switch in the linear mode, and establishing a resistance value of the damping resistor as a function of the measurement value of the current sensor.

13. The method of claim 8, wherein when the electronic switch is switched on, the semiconductor switch changes in a first step from the deactivated state to the linear mode and in a second step from the linear mode to the activated state.

* * * * *